US011244976B2

(12) United States Patent
Inoue et al.

(10) Patent No.: US 11,244,976 B2
(45) Date of Patent: Feb. 8, 2022

(54) PHOTOELECTRIC CONVERSION DEVICE, PHOTOELECTRIC CONVERSION SYSTEM, AND SIGNAL PROCESSING DEVICE

(71) Applicant: CANON KABUSHIKI KAISHA, Tokyo (JP)

(72) Inventors: Daisuke Inoue, Ebina (JP); Hirofumi Totsuka, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/702,772

(22) Filed: Dec. 4, 2019

(65) Prior Publication Data
US 2020/0194472 A1 Jun. 18, 2020

(30) Foreign Application Priority Data

Dec. 18, 2018 (JP) .............................. JP2018-236720

(51) Int. Cl.
*H01L 27/146* (2006.01)
*H04N 5/378* (2011.01)

(52) U.S. Cl.
CPC .... *H01L 27/1461* (2013.01); *H01L 27/14612* (2013.01); *H04N 5/378* (2013.01)

(58) Field of Classification Search
CPC ........... H01L 27/1461; H01L 27/14612; H01L 27/14614; H01L 27/14609; H01L 27/14601; H01L 27/146; H01L 27/14634; H01L 27/1464; H01L 27/14643; H04N 5/378; H04N 5/379; H04N 5/374; H04N 5/3745; H04N 5/37455
See application file for complete search history.

(56) References Cited

U.S. PATENT DOCUMENTS

| | | | |
|---|---|---|---|
| 5,008,698 A * | 4/1991 | Muramatsu | G02B 7/36 348/E3.019 |
| 7,633,540 B2 | 12/2009 | Totsuka | |
| 7,746,393 B2 * | 6/2010 | Watanabe | G06T 5/005 348/247 |
| 7,990,440 B2 | 8/2011 | Kobayashi et al. | |
| 8,084,729 B2 | 12/2011 | Kato et al. | |
| 8,154,639 B2 | 4/2012 | Kato et al. | |
| 8,189,081 B2 | 5/2012 | Totsuka | |
| 8,411,185 B2 | 4/2013 | Totsuka | |
| 8,482,660 B2 * | 7/2013 | Gough | H04N 5/2351 348/362 |
| 8,553,118 B2 | 10/2013 | Saito et al. | |

(Continued)

FOREIGN PATENT DOCUMENTS

JP 2018-042139 A 3/2018

*Primary Examiner* — John R Lee
(74) *Attorney, Agent, or Firm* — Venable LLP

(57) ABSTRACT

A photoelectric conversion device is provided. The photoelectric conversion device comprises a plurality of pixels each including a photoelectric conversion element, an output unit configured to output a signal for generating an image from each of the plurality of pixels, a detection unit configured to detect a maximum value and a minimum value of each of signals output from pixels included in a predetermined pixel group among the plurality of pixels; and a switching unit configured to allow the output unit or the detection unit to selectively process the signals output from the plurality of pixels. The detection unit and the switching unit are disposed for each of the plurality of pixels.

18 Claims, 3 Drawing Sheets

(56) References Cited

U.S. PATENT DOCUMENTS

| | | | |
|---|---|---|---|
| 8,605,182 B2 | 12/2013 | Totsuka et al. | |
| 8,710,558 B2 | 4/2014 | Inoue et al. | |
| 9,013,765 B2 | 4/2015 | Totsuka | |
| 9,282,263 B2 | 3/2016 | Totsuka | |
| 9,332,202 B2 | 5/2016 | Totsuka | |
| 9,350,958 B2 | 5/2016 | Totsuka et al. | |
| 9,521,337 B1* | 12/2016 | Shen | H04N 5/3355 |
| 9,716,849 B2 | 7/2017 | Kobayashi et al. | |
| 9,787,932 B2 | 10/2017 | Totsuka et al. | |
| 9,838,633 B2 | 12/2017 | Muto et al. | |
| 9,876,975 B2 | 1/2018 | Yoshida et al. | |
| 10,003,761 B2 | 6/2018 | Totsuka et al. | |
| 10,382,707 B2 | 8/2019 | Totsuka et al. | |
| 10,686,968 B1* | 6/2020 | Wei | G06T 7/20 |
| 2001/0001019 A1* | 5/2001 | Kadono | H04N 19/543 |
| | | | 382/277 |
| 2002/0154233 A1* | 10/2002 | Yoshimura | H04N 5/37455 |
| | | | 348/308 |
| 2014/0175592 A1* | 6/2014 | Iwabuchi | H01L 27/14627 |
| | | | 257/443 |
| 2017/0048474 A1* | 2/2017 | Nakamura | H04N 5/378 |
| 2018/0097960 A1* | 4/2018 | Ochiai | H04N 5/3575 |
| 2018/0249110 A1* | 8/2018 | Kobayashi | H04N 5/378 |
| 2018/0255257 A1* | 9/2018 | Takatsuka | H04N 5/378 |
| 2018/0278874 A1* | 9/2018 | Inada | H03M 1/56 |
| 2018/0302561 A1* | 10/2018 | Ikedo | H04N 5/23254 |
| 2019/0058842 A1 | 2/2019 | Totsuka et al. | |
| 2019/0104264 A1 | 4/2019 | Totsuka | |
| 2020/0194472 A1* | 6/2020 | Inoue | H01L 27/14612 |

* cited by examiner

PHOTOELECTRIC CONVERSION DEVICE, PHOTOELECTRIC CONVERSION SYSTEM, AND SIGNAL PROCESSING DEVICE

BACKGROUND OF THE INVENTION

Field of the Invention

The present invention relates to a photoelectric conversion device, a photoelectric conversion system, and a signal processing device.

Description of the Related Art

The photoelectric conversion device may detect the motion of a subject by using a low-resolution image having a lower resolution than the resolution of a pixel area. The low-resolution image is generated by dividing pixels arranged in the pixel region into a plurality of blocks and using an average value or a median value of pixel values of signals output from the pixels included in each block. Japanese Patent Laid-Open No. 2018-42139 discloses that an average value of pixel values is obtained by summing the pixel values of signals output from pixels included in a block.

SUMMARY OF THE INVENTION

When pixel values are averaged for each block in order to obtain a low-resolution image, the obtained low-resolution image has a lower contrast than a normal imaged image. Thus, in a case where the density difference of a subject is small, the motion of the subject is hard to be detected. In addition, when the number of pixels constituting the block increases, in a case where the subject is small, the signals output from the pixels in which the subject is imaged are buried in the average value of the signals output from the pixel in which the background of the subject is imaged, making it difficult to detect the motion of the subject.

Some embodiments of the present invention provide a technique for suppressing a decrease in contrast of a low-resolution image.

According to some embodiments, a photoelectric conversion device comprising: plurality of pixels each including a photoelectric conversion element; an output unit configured to output a signal for generating an image from each of the plurality of pixels; a detection unit configured to detect a maximum value and a minimum value of each of signals output from pixels included in a predetermined pixel group among the plurality of pixels; and a switching unit configured to allow the output unit or the detection unit to selectively process the signals output from the plurality of pixels, wherein, the detection unit and the switching unit are disposed for each of the plurality of pixels, is provided.

According to some other embodiments, a signal processing device configured to processing signals output from a plurality of pixels each including a photoelectric conversion element, the signal processing device comprising: an output unit configured to output a signal for generating an image from each of the plurality of pixels; a detection unit configured to detect a maximum value and a minimum value of signals output from pixels included in a predetermined pixel group among the plurality of pixels; and a switching unit configured to allow the output unit or the detection unit to selectively process the signals output from the plurality of pixels, wherein, the detection unit and the switching unit are disposed for each of the plurality of pixels, is provided.

Further features of the present invention will become apparent from the following description of exemplary embodiments (with reference to the attached drawings).

DESCRIPTION OF THE EMBODIMENTS

Figure 1:
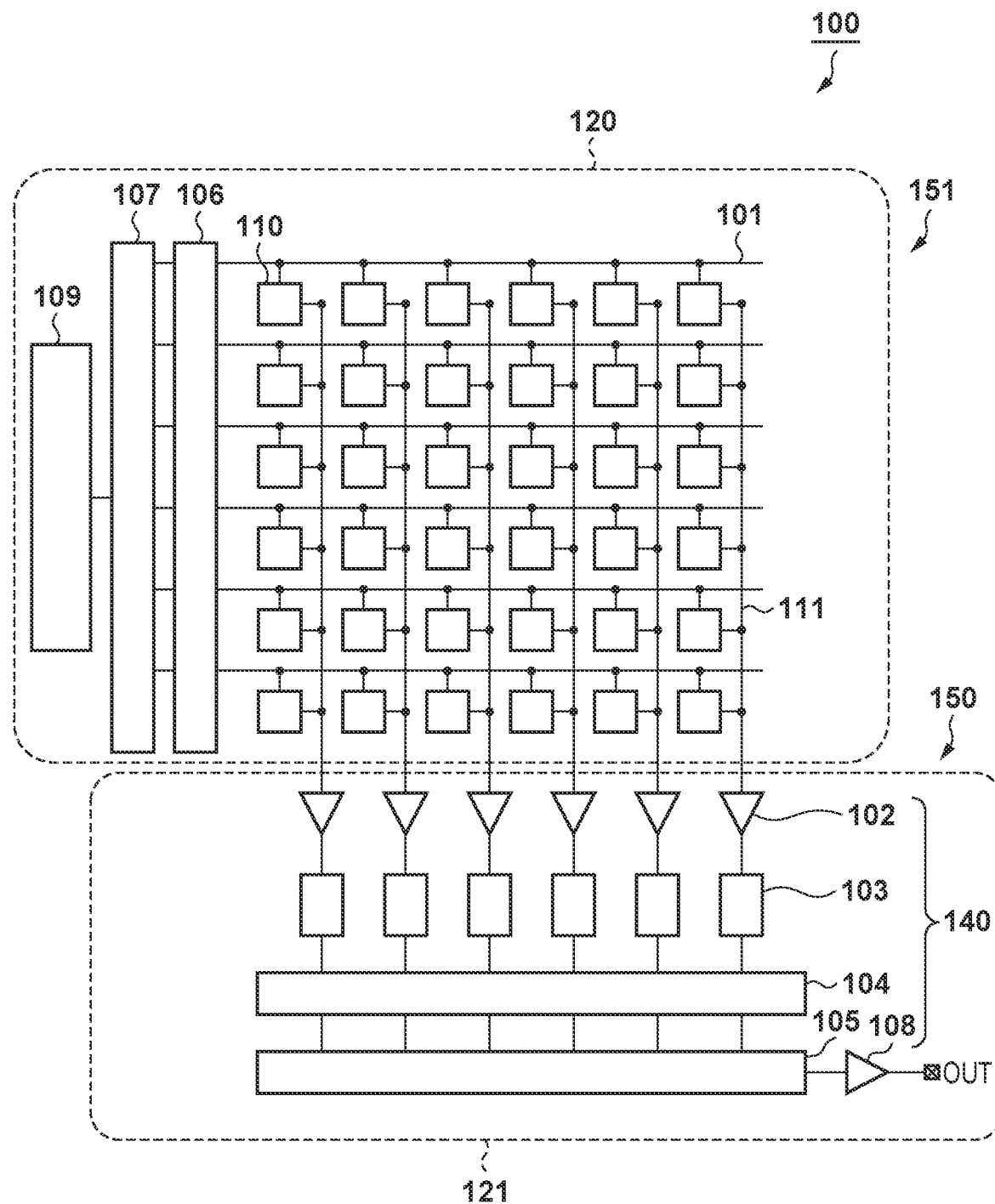
FIG. 1 is a view illustrating an exemplary configuration of a photoelectric conversion device according to an embodiment of the present invention.

Hereinafter, a specific embodiment of a photoelectric conversion device according to the present invention will be described with reference to the accompanying figures. Throughout the following description and figures, common components are given respective common reference numerals.

Therefore, the common components with the respective common reference numerals are described with reference to the figures, and the description of the common components is omitted as appropriate.

The configuration of the photoelectric conversion device according to the embodiment of the present invention will be described with reference to FIGS. 1 to 4. FIG. 1 illustrates an exemplary configuration of a photoelectric conversion device 100 according to the present embodiment. The photoelectric conversion device 100 includes a pixel unit 151 including a plurality of pixels 110 each including a photoelectric conversion element; and an output unit 140 for outputting a signal for generating an image from each of the plurality of pixels. The pixel unit 151 and the output unit 140 can be formed on semiconductor substrates 120 and 121 made of silicon or the like by using, for example, a CMOS process. The pixel unit 151 including the plurality of pixels 110 is disposed on the substrate 120 (first substrate). In the present embodiment, the output unit 140 is disposed on the substrate 121 (second substrate) other than the substrate 120. The substrate 120 and the substrate 121 are at least partially stacked.

As illustrated in FIG. 1, the plurality of pixels 110 can be arranged in an array in a row direction (horizontal direction in FIG. 1) and in a column direction (vertical direction in FIG. 1). The pixels 110 arranged in the column direction are connected to a common vertical signal line 111. The signals output from the pixels 110 are analog-to-digital converted by a column circuit constituted of a gain stage amplifier 102 arranged for each column and a comparator 103 for comparison with a ramp voltage. The analog-to-digital converted signals can be output as, for example, digital data with a gradation of at least 8 bits or more. The driving of the pixels 110 is controlled for each row by a pulse signal output circuit 106 via a common pixel control line 101. The reading order of the pulse signal output circuit 106 is controlled in the row direction by a vertical decoder circuit 107 controlled by a timing generator 109. The signals output from the gain stage amplifier 102 and the comparator 103 and digitized are held in a frame memory group 104. The signals held in the frame memory group 104 are sequentially read by a digital front end 105 that performs processing such as signal correction and rearrangement and are output to the outside from an output terminal OUT through an LVDS output circuit 108. The output unit 140 includes the gain stage amplifier 102, the comparator 103, the frame memory group 104, the digital front end 105, and the LVDS output circuit 108.

The pulse signal output circuit 106, the vertical decoder circuit 107, and the timing generator 109 are disposed on the substrate 120. On the other hand, the gain stage amplifier 102, the comparator 103, the frame memory group 104, the digital front end 105, and the LVDS output circuit 108 are disposed on the substrate 121. By stacking the substrate 120 and the substrate 121, the area of an IC chip that constitutes the photoelectric conversion device 100 can be reduced. In addition, the pixel unit 151 including the pixels 110, and the gain stage amplifier 102 and the comparator 103, are disposed on the separate substrates 120 and 121. As a result, it becomes possible to use a manufacturing process (process rule or the like) suitable for each configuration of each substrate, thereby efficiently reducing the area of the IC chip. In the present embodiment, the substrate 120 and the substrate 121 are stacked. However, in a case where there is no restriction on the area of the chip, the above-described components may be provided on the same substrate.

Figure 2:
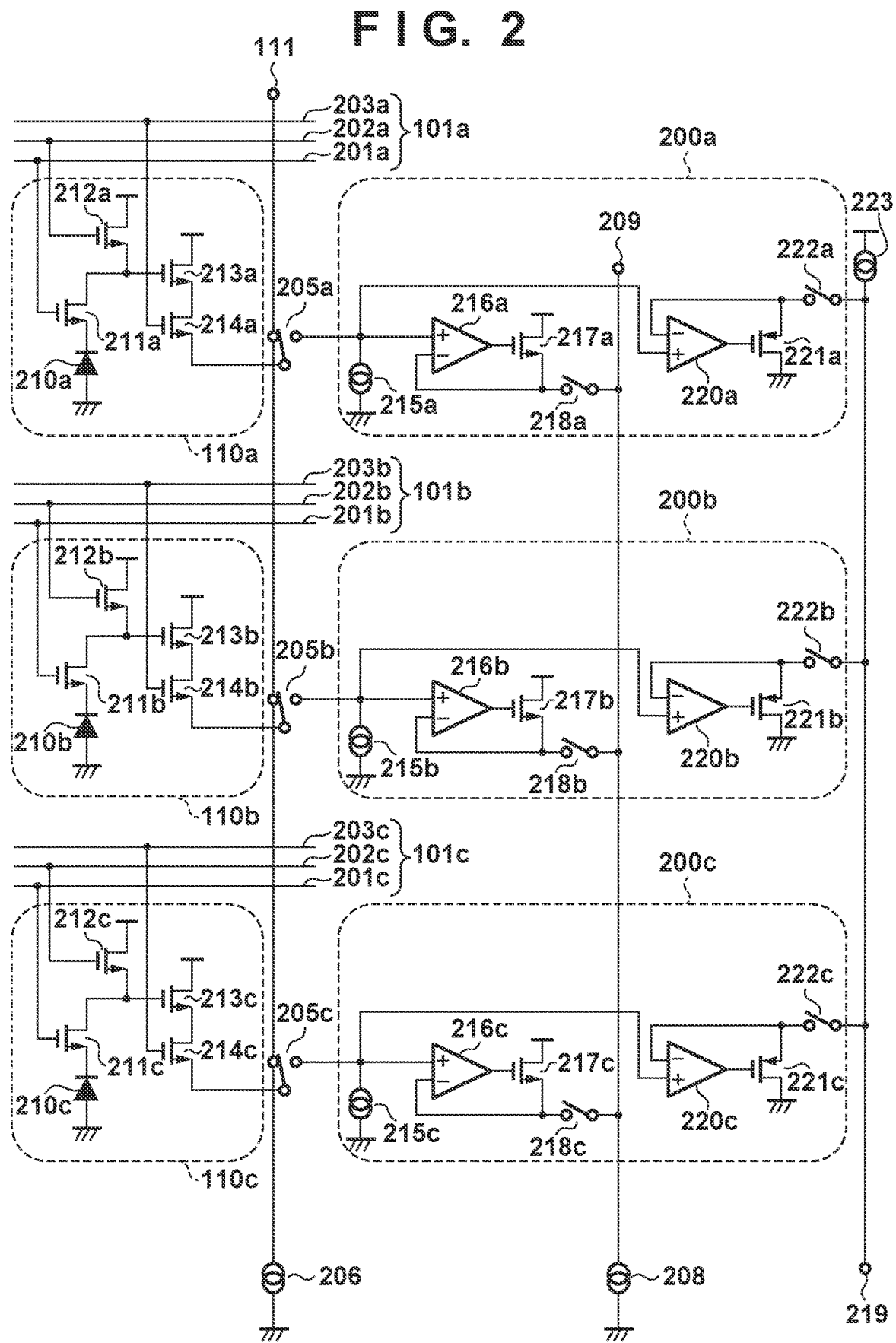
FIG. 2 is a view illustrating exemplary configurations of pixels and a detection unit of the photoelectric conversion device in FIG. 1.

Next, the configuration for generating a low-resolution image having a lower resolution than the resolution of the pixel area in which the plurality of pixels 110 are disposed in the present embodiment will be described. FIG. 2 illustrates an exemplary configuration of a detection unit 200 (200a to 200c) for detecting a maximum value and a minimum value of signals output from pixels 110a to 110c included in a predetermined pixel group among the plurality of pixels 110, in order to obtain a low-resolution image. Here, three pixels 110a to 110c among the plurality of pixels 110 are described as one pixel group, but the number of pixels included in the pixel group for obtaining the low-resolution image is not limited to three. In addition, in a case where a particular pixel among the pixels 110 is described, a subscript is added to a reference number, as in the pixel 110 "a". The same applies to other components.

The pixels 110 each include a photoelectric conversion element 210, a transfer transistor 211, a reset transistor 212, an amplification transistor 213, and a selection transistor 214. For example, a photodiode is used as the photoelectric conversion element 210. A transfer control line 201 among the pixel control lines 101 is connected to a gate electrode of the transfer transistor 211. A reset control line 202 among the pixel control lines 101 is connected to a gate electrode of the reset transistor 212. A selection control line 203 among the pixel control lines 101 is connected to a gate electrode of the selection transistor 214.

When the gate voltage of the transfer transistor 211 is at the Lo level, an electric charge corresponding to light incident on the photoelectric conversion element 210 is accumulated. Further, when the gate voltage of the transfer transistor 211 becomes the Hi level, the accumulated electric charge is transferred to a floating diffusion region.

The transferred electric charge signal is converted into a voltage by the amplification transistor 213. The signal converted into the voltage is routed to a load transistor 206 for signal reading or a load transistor 215 for detecting the maximum value and the minimum value of the signal by a switching unit 205 and is selectively supplied to the output unit 140 or the detection unit 200.

In a case where the load transistor 206 is selected by the switching unit 205, the signals output from the pixels 110 in the row selected by the selection transistor 214 are output to the vertical signal line 111 and transferred to the output unit 140. On the other hand, in a case where the load transistor 215 is selected by the switching unit 205, the signals output from the pixels 110 are transferred to the detection unit 200, and the maximum value and the minimum values of each of the signals output from the pixels 110a to 110c included in the pixel group are detected.

In the present embodiment, as illustrated in FIG. 2, the switching unit 205 is illustrated as a switch for selectively supplying the signals output from the plurality of pixels 110 to the output unit 140 or the detection unit 200. However, the switching unit is not limited to this. For example, the output of the selection transistor 214 may be connected to both the vertical signal line 111 and the detection unit 200. In this case, the switching unit 205 operates such that the signals output from the plurality of pixels 110 are selectively processed by the output unit 140 or the detection unit 200. For example, in a case where the signal for generating an image from each of the plurality of pixels 110 is output, the switching unit 205 may set the output unit 140 in an active state and the detection unit 200 in an inactive state. Similarly, in a case where a low-resolution image is obtained, the switching unit 205 may set the output unit 140 in the inactive state and the detection unit 200 in the active state. The switching unit 205 may be configured to output signals processed by the output unit 140 or the detection unit 200 at an appropriate timing.

The detection unit 200 includes a maximum value detection amplifier 216, a maximum value detection amplification transistor 217, a maximum value detection switch 218, a minimum value detection amplifier 220, a minimum value detection amplification transistor 221, and a minimum value detection switch 222. In FIG. 2, the pixels 110a to 110c of 1 row×3 columns among the pixels 110 are set as one pixel group, and the switching units 205a to 205c select the load transistors 215a to 215c, respectively. Accordingly, the detection units 200a to 200c detect the maximum value and the minimum value of each of the signals output from the pixels 110a to 110c included in the pixel group.

In the present embodiment, the pixels 110a to 110c of 1 row×3 columns among the plurality of pixels 110 are set as one pixel group. However, for example, the pixels 110 of 100 rows×100 columns among the plurality of pixels 110 may be set as one pixel group. The detection unit 200 can be disposed on the substrate 121 on which the output unit 140 is disposed. The switching unit 205 can be also disposed on the substrate 121. The output unit 140, the detection unit 200, and the switching unit 205 on the substrate 121 function as a signal processing device 150 for processing signals output from the plurality of pixels 110. The pixel 110 often has a relatively large pattern. On the other hand, in order to increase the processing capability, the output unit 140 and the detection unit 200, which function as the signal processing device 150, may require a finer process rule than the pixel 110 does. For this reason, the area of the IC chip can be efficiently reduced by using the substrate 120 on which the pixels 110 are disposed and the other substrate 121 on which the output unit 140 and the detection unit 200 are disposed.

In a case where the maximum value (i.e., bottom output) of the signals output from the pixels 110a to 110c included in the pixel unit is detected, the maximum value detection switch 218 is turned on to operate the maximum value detection amplification transistor 217 by a common maximum value detection load transistor 208, thereby extracting the maximum value from an output terminal 209. Similarly, in a case where the minimum value (i.e., peak output) of each of the signals of the pixels 110a to 110c included in the pixel unit is detected, the minimum value detection switch 222 is turned on to operate the minimum value detection amplification transistor 221 by a common minimum value detection load transistor 223, thereby extracting the minimum value from an output terminal 219.

As described above, the switching unit 205 can switch between a path connected to the vertical signal line 111 to read the signals for generating an image and a path connected to the detection unit 200 to extract the maximum value and the minimum value of each of the signals output from the pixels 110 included in the pixel group. In the state of detecting the motion of the subject, the detection unit 200 is used to detect the maximum value and the minimum value (peak and bottom detection) of each of the signals output from the pixels 110, detect the motion and then, perform imaging and switch to driving to read signals.

Figure 3:
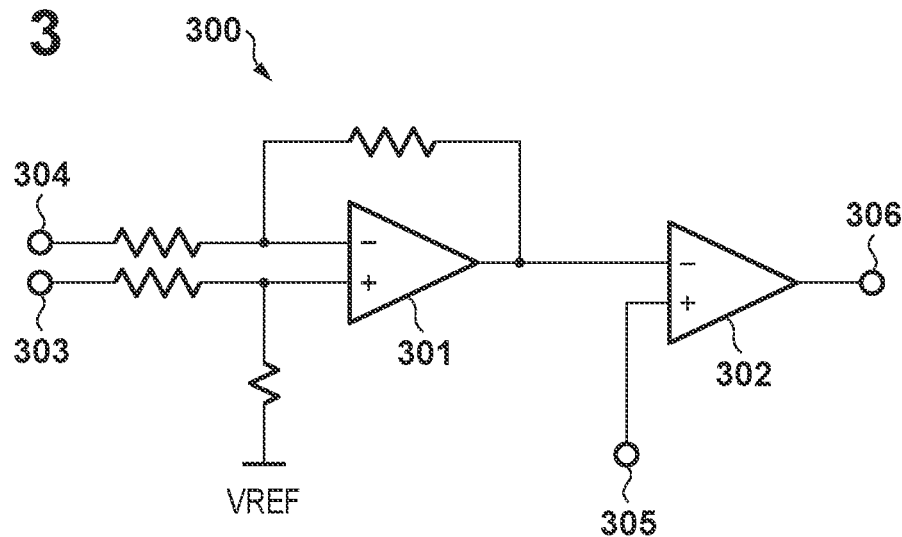
FIG. 3 is a view illustrating an exemplary configuration of a comparison unit of the photoelectric conversion device in FIG. 1.

FIG. 3 is a view illustrating an exemplary configuration of a comparison unit 300 for comparing whether the difference between the maximum value and the minimum value of each of the signals, which are detected by the detection unit 200, illustrated in FIG. 2 is equal to or greater than a predetermined value. The comparison unit 300 may be disposed on the substrate 121. That is, the photoelectric conversion device 100 (signal processing device 150) may include the comparison unit 300. The comparison unit 300 includes a differential amplifier 301, a comparator 302, and input terminals 303 and 304. The input terminal 303 and the input terminal 304 are connected to the output terminal 209 and the output terminal 219 in FIG. 2, respectively. The differential amplifier 301 amplifies the difference signal between the maximum value and the minimum value of each of the signals output from the pixels 110a to 110c included in the pixel group, using a voltage VREF as a reference. Next, the comparator 302 compares the voltage VREF with a reference voltage 305 supplied from a constant voltage source (not illustrated), and outputs Hi/Lo binary digital data from a comparison value output 306.

In a case where the difference signal is equal to or greater than a predetermined value, that is, a case where a sufficient difference signal output is obtained, a Hi-level logic output is output from the comparison value output 306. On the other hand, in a case where the difference signal is less than the predetermined value, that is, a case where a sufficient difference signal output is not obtained, a Lo-level logic output is output from the comparison value output 306. Based on this output comparison result, it can be determined whether a sufficient contrast signal for the subject has been obtained.

Next, signal processing for detecting the subject based on the maximum value and the minimum value of each of the signals from each pixel group, which are detected by the detection unit 200, will be described. For example, the signal processing unit that performs signal processing for detecting the subject may be provided on the substrate 121, may be provided on a substrate other than the substrates 120 and 121, or may be stacked on the substrates 120 and 121. That is, the photoelectric conversion device 100 (signal processing device 150) may include a signal processing unit for detecting the subject. In addition, the signal processing unit for detecting the subject may be provided separately from the photoelectric conversion device 100 and may constitute a photoelectric conversion system together with the photoelectric conversion device 100.

Figure 4A:
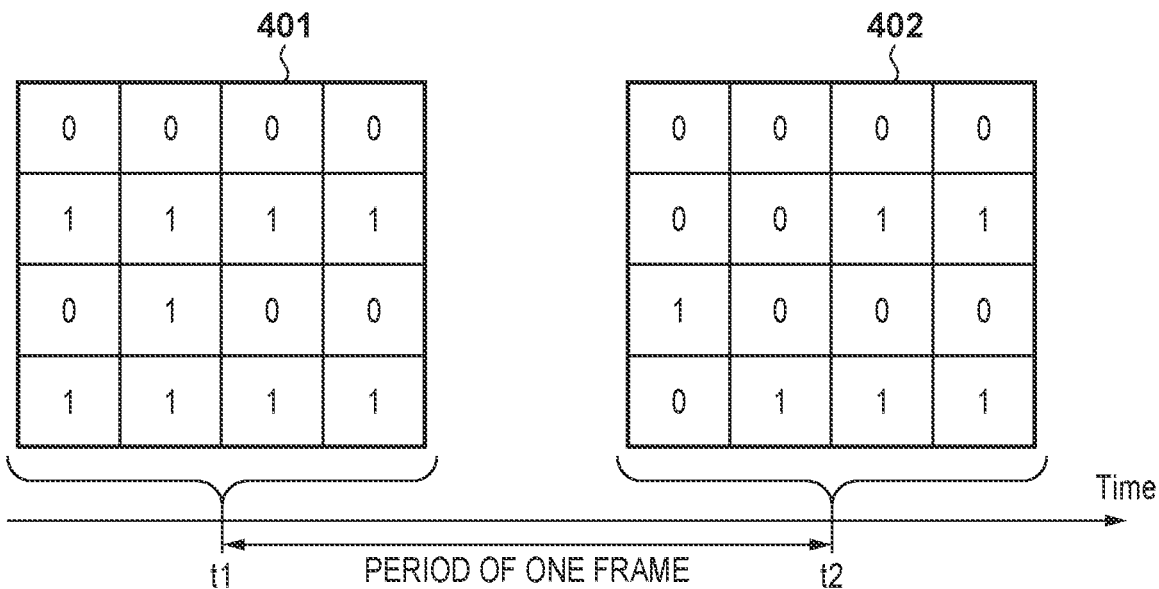
FIGS. 4A and 4B are views illustrating a method for detecting a subject by using signals output from the photoelectric conversion device in FIG. 1.
Figure 4B:
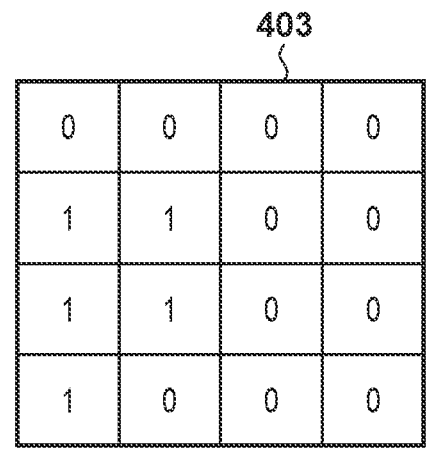

FIG. 4A illustrates the comparison result for each pixel group, expanded across the plurality of pixels 110 and mapped with signals (contrast signals) of the comparison result. For simplification, in FIG. 4A, the entire plurality of pixels 110 are divided into the pixel groups of 4 rows×4 columns. However, the division may be into more pixel groups depending on the number of disposed pixels 110. A map 401 is a block map for each pixel group of the contrast signal at a time t1, and a map 402 is a block map for each pixel group of the contrast signal at a time t2. The time t2 is a time later than the time t1, and an interval between the time t1 and the time t2 is, for example, a period of one frame. A map 403 illustrated in FIG. 4B is obtained by taking a difference between the contrast signal map 401 at the time t1 and the contrast signal map 402 at the time t2.

The map 403 indicating the difference between the contrast signals can be obtained by the signal processing unit described above. The signal processing unit can detect that the subject is moving if a difference between the previous and subsequent frames is obtained in the map 403.

For example, first, in the period (first period) during which the motion of the subject is detected, the switching unit 205 allows the detection unit 200 to process signals output from the plurality of pixels 110, such that the detection unit 200 detects the maximum value and the minimum value of each of the signals from a predetermined pixel group. Next, the signal processing unit detects the subject based on the maximum value and the minimum value of each of the detected signals. More specifically, as illustrated in the map 403 indicating the difference between the contrast signals, the signal processing unit determines that the subject has been detected based on the fact that the comparison result of the comparison unit 300 for the predetermined pixel group has changed between the previous and subsequent frames. In response to the detection of the subject by the signal processing unit, the photoelectric conversion device 100 images the subject and shifts to a period (second period) for generating an image. In the period for generating the image, the switching unit 205 allows the output unit 140 to process the signals output from the plurality of pixels 110, such that the output unit 140 outputs a signal for generating the image from each of the plurality of pixels 110. Thereby, the user can acquire a detailed image (for example, a moving image) according to the resolution of the pixel area in which the plurality of pixels 110 are arranged.

In addition, when detecting the motion of the subject, the operation of simultaneously acquiring an average value of the signals output from the pixels 110 included in each pixel group in each frame; and the operation of using a difference between average value maps may be combined. For example, the photoelectric conversion device 100 may include an average value acquisition unit for acquiring an average value of the signals output from the pixels 110 included in each pixel group. Further, for example, an average value acquisition unit may be provided separately from the photoelectric conversion device 100, and the photoelectric conversion system may be configured in the same manner as the signal processing unit described above. Then, in the period for detecting the motion of the subject, the signal processing unit detects the subject based on the maximum value and the minimum value of each of the detected signals along with the average value acquired by the average value acquisition unit.

By using the average value acquired by the average value acquisition unit to detect the subject, it is possible to detect the motion of the subject even when the subject is moving in an intermediate amount of light. Therefore, the photoelectric conversion device 100 (photoelectric conversion system) of the present embodiment can detect that the subject is moving with higher accuracy. That is, even in the state where there is no difference change such that a sufficient contrast signal cannot be obtained, the accuracy of detecting the operating state can be improved by reading an addition average value output signal of the floating diffusion capacitance from the pixel signal.

As described above, since the maximum value (i.e., bottom output) and the minimum value (i.e., peak output) of each of the signals output from the pixels 110 included in each pixel group can be detected (peak bottom detection) to detect contrast of the subject based on the difference between the maximum value and the minimum value of each signal, the accuracy of detecting the motion of the subject by using the low-resolution image can be improved. Further, in each pixel group, a binary logical determination value is obtained as a comparison result of peak bottom detection. On the other hand, in a case where the average value of the signals output from the pixels 110 included in each pixel group is acquired, the average value of each pixel group is, for example, digital data with a gradation of 8 bits or more. That is, when detecting the motion of the subject, the maximum value and the minimum value of each of the signals output from the pixels 110 included in the pixel group are detected. Next, by comparing whether the difference between the maximum value and the minimum value of each of the detected signals is equal to or greater than a predetermined value, the data amount of the contrast signal map can be reduced to 1/100 or less.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-236720, filed Dec. 18, 2018 which is hereby incorporated by reference herein in its entirety.

What is claimed is:

1. A photoelectric conversion device comprising:
    a plurality of pixels each (a) including a photoelectric conversion element and (b) outputting one of a respective plurality of output signals, wherein the plurality of pixels includes a predetermined group of pixels;
    a plurality of detection units, each detection unit (a) corresponding to a respective pixel of the predetermined group of pixels and (b) being configured to detect a maximum value or a minimum value of the output signal of the respective pixel;
    an output unit configured to output imaging signals respectively corresponding to the plurality of pixels in accordance with the plurality of output signals; and
    a plurality of switching units, each switching unit (a) corresponding to a respective pixel of the predetermined group of pixels and to a respective detection unit of the plurality of detection units and (b) being configured to selectively allow the output unit or the respective detection unit to process the output signal of the respective pixel.

2. The photoelectric conversion device according to claim 1, wherein each switching unit includes a switch configured to selectively supply the output signal of the respective pixel to the output unit or to the respective detection unit.

3. The photoelectric conversion device according to claim 1, wherein the plurality of pixels are disposed on a first substrate,
    wherein the output unit is disposed on a second substrate other than the first substrate, and
    wherein the first substrate and the second substrate are at least partially stacked.

4. The photoelectric conversion device according to claim 3, wherein the plurality of detection units are disposed on the second substrate.

5. The photoelectric conversion device according to claim 1, further comprising a comparison unit, wherein each of the plurality of detection units detects a maximum value and a minimum value of the output signal of the respective pixel, and the comparison unit is configured to compare whether a difference between the maximum value and the minimum value detected by a detection unit of the plurality of detection units is equal to or greater than a predetermined value.

6. The photoelectric conversion device according to claim 1, further comprising a signal processing unit, wherein each of the plurality of detection units detects a maximum value and a minimum value of the output signal of the repsective pixel, and the signal processing unit is configured to detect a subject based on the maximum value and the minimum value detected by a detection unit of the plurality of detection units.

7. The photoelectric conversion device according to claim 5, further comprising a signal processing unit configured to detect a subject based on a comparison result of the comparison unit.

8. The photoelectric conversion device according to claim 6, wherein in a first period, (a) each switching unit allows the respective detection unit to process the output signal of the respective pixel of the predetermined pixel group, such that the plurality of detection units detect the maximum value and the minimum value of each of the output signals for the predetermined pixel group, (b) the signal processing unit detects the subject based on the maximum value and the minimum value of each output signal for the predetermined pixel group, and (c) in response to a detection of the subject by the signal processing unit, the photoelectric conversion device shifts to a second period, and
    wherein in the second period, (a) each switching unit allows the output unit to process the output signal of the respective pixel, and (b) the output unit outputs imaging signals respectively corresponding to the plurality of pixels.

9. The photoelectric conversion device according to claim 7, wherein in a first period, (a) each switching unit allows the respective detection unit to process the output signal of the respective pixel of the predetermined pixel group, such that the plurality of detection units detect the maximum value and the minimum value of each of the output signals for the predetermined pixel group, (b) the signal processing unit detects the subject based on a fact that the comparison result of the comparison unit for the predetermined pixel group has changed between frames, and (c) in response to a detection of the subject by the signal processing unit, the photoelectric conversion device shifts to a second period, and
    wherein in the second period, (a) each switching unit allows the output unit to process the output signal of the respective pixel, and (b) the output unit outputs imaging signals respectively corresponding to the plurality of pixels.

10. The photoelectric conversion device according to claim 8, further comprising:
    an average value acquisition unit configured to acquire an average value of the output signals from the pixels included in the predetermined pixel group,
    wherein in the first period, the signal processing unit detects the subject based on (a) the maximum value and the minimum value and (b) the average value acquired by the average value acquisition unit.

11. A photoelectric conversion system comprising:
the photoelectric conversion device according to claim 1; and
a signal processing unit configured to detect a subject based on the maximum value or the minimum value detected by a detection unit of the plurality of detection units.

12. A photoelectric conversion system comprising:
the photoelectric conversion device according to claim 5; and
a signal processing unit configured to detect a subject based on a comparison result of the comparison unit.

13. The photoelectric conversion system according to claim 11, wherein in a first period, (a) each switching unit allows the respective detection unit to process the output signal of the respective pixel of the predetermined pixel group, such that the plurality of detection units detect the maximum value and the minimum value of each of the output signals for the predetermined pixel group, (b) the signal processing unit detects the subject based on the maximum value and the minimum value of each output signal for the predetermined pixel group, and (c) in response to a detection of the subject by the signal processing unit, the photoelectric conversion system shifts to a second period, and
wherein in the second period, (a) each switching unit allows the output unit to process the output signal of the respective pixel, and (b) the output unit outputs imaging signals respectively corresponding to the plurality of pixels.

14. The photoelectric conversion system according to claim 12, wherein in a first period, (a) each switching unit allows the respective detection unit to process the output signal of the respective pixel of the predetermined pixel group, such that the plurality of detection units detect a maximum value and a minimum value of each of the output signals for the predetermined pixel group, (b) the signal processing unit detects the subject based on a fact that the comparison result of the comparison unit for the predetermined pixel group has changed between frames, and (c) in response to a detection of the subject by the signal processing unit, the photoelectric conversion system shifts to a second period, and
wherein in the second period, (a) each switching unit allows the output unit to process the output signal of the respective pixel, and (b) the output unit outputs imaging signals respectively corresponding to the plurality of pixels.

15. The photoelectric conversion system according to claim 13, further comprising an average value acquisition unit configured to acquire an average value of the output signals from the pixels included in the predetermined pixel group,
wherein in the first period, the signal processing unit detects the subject based on (a) the maximum value and the minimum value and (b) the average value acquired by the average value acquisition unit.

16. A signal processing device configured to process a plurality of output signals output from a respective plurality of pixels each including a photoelectric conversion element, wherein the plurality of pixels includes a predetermined group of pixels, the signal processing device comprising:
a plurality of detection units, each detection unit (a) corresponding to a respective pixel of the predetermined group of pixels and (b) being configured to detect a maximum value or a minimum value of the output signal of the respective pixel;
an output unit configured to output imaging signals respectively corresponding to the plurality of pixels in accordance with the plurality of output signals; and
a plurality of switching units, each switching unit (a) corresponding to a respective pixel of the predetermined group of pixels and to a respective detection unit of the plurality of detection units and (b) being configured to selectively allow the output unit or the respective detection unit to process output signal of the respective pixel.

17. The photoelectric conversion device according to claim 1, wherein each of the plurality of detection units detects a maximum value and a minimum value of the output signal of the respective pixel.

18. The signal processing device according to claim 16, wherein each of the plurality of detection units detects a maximum value and a minimum value of the output signal of the respective pixel.

* * * * *